(12) United States Patent
Cha et al.

(10) Patent No.: US 7,707,021 B2
(45) Date of Patent: Apr. 27, 2010

(54) CIRCUIT EMULATION WITH STATE RECOVERY

(75) Inventors: Chi-Ho Cha, Hwaseong-si (KR); Hyunuk Jung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 516 days.

(21) Appl. No.: 11/673,368

(22) Filed: Feb. 9, 2007

(65) Prior Publication Data
US 2007/0265823 A1 Nov. 15, 2007

(30) Foreign Application Priority Data
May 12, 2006 (KR) ...................... 10-2006-0043080

(51) Int. Cl.
G06F 9/455 (2006.01)
G06F 11/22 (2006.01)
(52) U.S. Cl. ............................ 703/23; 703/16; 717/134
(58) Field of Classification Search ................... 703/14, 703/23, 16; 716/4; 717/134
See application file for complete search history.

(56) References Cited

U.S. PATENT DOCUMENTS

| 5,321,828 | A | * | 6/1994 | Phillips et al. ................ 703/28 |
| 5,812,823 | A | | 9/1998 | Kahle et al. |
| 6,377,912 | B1 | * | 4/2002 | Sample et al. ................ 703/28 |
| 6,694,464 | B1 | * | 2/2004 | Quayle et al. ................ 714/725 |
| 2002/0161568 | A1 | * | 10/2002 | Sample et al. ................ 703/25 |
| 2002/0177990 | A1 | * | 11/2002 | Sample ........................ 703/28 |
| 2003/0074178 | A1 | * | 4/2003 | Sample et al. ................ 703/25 |
| 2003/0182641 | A1 | * | 9/2003 | Yang ............................ 716/4 |
| 2006/0075367 | A1 | * | 4/2006 | Chan ............................ 716/6 |
| 2007/0083353 | A1 | * | 4/2007 | Selvidge et al. .............. 703/23 |
| 2008/0098339 | A1 | * | 4/2008 | Chan ............................ 716/6 |

FOREIGN PATENT DOCUMENTS

| JP | 06-119207 | 4/1994 |
| JP | 10-87790 | 7/1998 |
| KR | 1997-59925 | 8/1997 |

OTHER PUBLICATIONS

English Abstract for Japanese Publication No. 10-187790.
English Abstract for Japanese Publication No. 06-119207.

* cited by examiner

*Primary Examiner*—Thai Phan
(74) *Attorney, Agent, or Firm*—F. Chau & Associates, LLC

(57) ABSTRACT

A circuit emulation system and method are provided, the system including at least one trace chain and a trace memory in signal communication with the at least one trace chain for sequentially receiving values and feeding them back through the chain to their original storage unit positions; and the method including modeling the circuit, providing at least one storage unit in the model, emulating the circuit with the model, extracting a state of the at least one storage unit during emulation, storing the extracted state, and restoring the stored state through a feedback loop.

23 Claims, 14 Drawing Sheets

(a) Trace chain symbol connected
to the input/output ports of a macro cell (b) Trace chain symbol connected to the input/output ports of a macro cell

Fig. 12
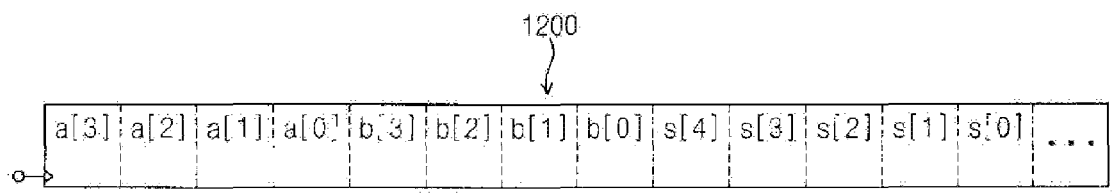
(a) Saving a[3:0], b[3:0], s[4:0] in serial format in a trace memory
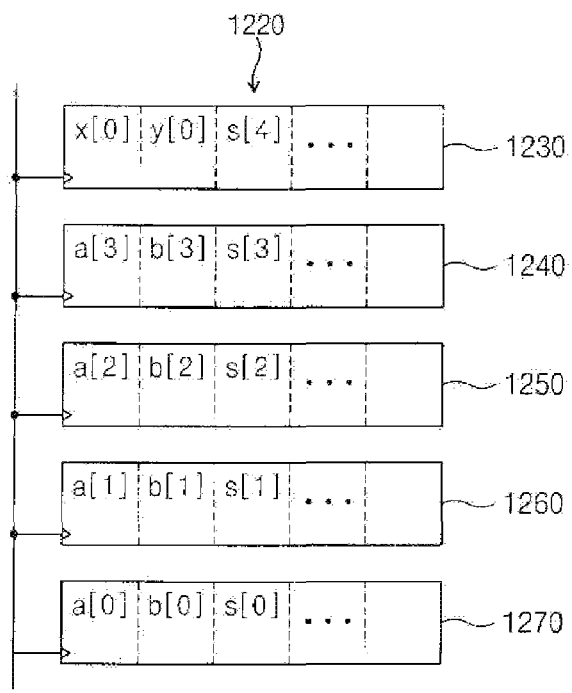
(a) Saving a[3:0], b[3:0], s[4:0] in parallel format in a trace memory, another data or dummy data bit x[0], y[0]

CIRCUIT EMULATION WITH STATE RECOVERY

CROSS-REFERENCE TO RELATED APPLICATION

This application claims foreign priority under 35 U.S.C. § 119 to Korean Patent Application No. 2006-43080, filed on May 12, 2006 in the Korean Intellectual Property Office, the disclosure of which is incorporated by reference herein in its entirety.

BACKGROUND OF THE INVENTION

The present disclosure relates to hardware development tools. More particularly, the present disclosure relates to digital circuit testing and emulation systems.

The simulation time of a conventional simulation system generally increases exponentially with an increasing circuit size. If there is an error during a functional verification, an additional simulation needs to be made from the beginning of the simulation to a time after the error position. The error position is typically detected by searching backwards from the primary port in the top level.

If the states are known for all of the storage units in a target digital circuit, a distributed simulation can be made in terms of time and space. The ability to quickly save, restore and change the states of the storage units is important in Distributed Simultaneous-Cycle Based Simulation (DS-CBS), for example.

As shown in FIG. 1, a conventional digital circuit testing system is indicated generally by the reference numeral 100. The system 100 includes original logic 110 and additional logic 120. Here, the original logic 110 includes a first flip-flop 112 combinational logic 114 in signal communication with the first flip-flop 112, and a second flip-flop 116 in signal communication with the combinational logic 114. The additional logic 120 includes control logic 122, a multiplexer 124 in signal communication with the control logic 122 and the first flip-flop 112, a third flip-flop 126 in signal communication with the multiplexer 124, and a memory 128 in signal communication with the third flip-flop 126.

In the conventional digital circuit testing system 100, the additional logic 120 is used to save the states of the storage units. The additional control logic, flip-flops and memory are used to monitor the states of the original flip-flops and nets. For example, the additional flip-flop F3 or 126 is assigned to save the state of the original flip-flop F1 or 112. A Normal clock, Nclk and a sampling clock, Dclk, are provided. States of the storage units of the original logic are sampled and saved to the fixed capacity embedded memory 128, and the data in the memory is output with a Joint Test Action Group (JTAG) interface.

Unfortunately, the storage capacity has a fixed limit because of the size of the embedded memory 128. Because Nclk and Dclk are always running, it is impossible to monitor the original logic in real time. The memory outputs the previous states of the running logic. In addition, no feedback path is provided to restore the stored states to the original logic.

Turning to FIG. 2, another conventional digital circuit testing system is indicated generally by the reference numeral 200. The system 200 includes original logic 210 and additional logic 230. The original logic includes a first flip-flop 212, an inverter 214 in signal communication with the first flip-flop, a first NAND gate 216 in signal communication with the inverter, a second NAND gate 218 in signal communication with the first NAND gate, a second flip-flop 220 in signal communication with the second NAND gate, a third NAND gate 222 in signal communication with the second flip-flop, and a third flip-flap 224 in signal communication with the third NAND gate.

The additional logic 230 includes a first multiplexer 232 in signal communication with the first flip-flop 212, a fourth flip-flap 234 in signal communication with the first multiplexer, a second multiplexer 236 in signal communication with the second flip-flop 220 and the fourth flip-flop, a fifth flip-flap 238 in signal communication with the second multiplexer, and a third multiplexer 240 in signal communication with the fifth flip-flop.

The conventional system 200 has no embedded memory, but does have the additional control logic and flip-flops to monitor the states of original flip-flops and nets. The system 200 uses register shifting to save the captured states of the additional logic in order to monitor the original logic. That is, the additional logic is used to monitor or test the original logic. Unfortunately, the system 200 also lacks a feedback path to restore the captured states to the original logic.

Turning now to FIG. 3, yet another conventional digital circuit testing system is indicated generally by the reference numeral 300. Here, a first model 310 includes a sequential circuit 312 in signal communication with flip-flops 314, 316 (not shown) and 318. A second model 340 includes the sequential circuit 312 in signal communication with the flip-flops 314, 316 and 318, and a scan circuit 350.

The scan circuit 350 includes a scan_enable terminal 368; a scan_in terminal 352; a first multiplexer 354 in signal communication with the scan_enable terminal, the combinational circuit 312, and the scan_in terminal; the first flip-flop 314 in signal communication with the first multiplexer; a second multiplexer 358 in signal communication with the scan_enable terminal, the combinational circuit 312, and the first flip-flop; the second flip-flop 316 in signal communication with the second multiplexer; a third multiplexer 362 in signal communication with the scan_enable terminal, the combinational circuit 312, and the second flip-flop; the third flip-flop 318 in signal communication with the third multiplexer; and a scan_out terminal 366 in signal communication with the third flip-flop.

Unfortunately, the system 300 uses the scan chain or circuit 350 only to test the original logic. A real scan flip-flop is used in a scan chain to capture and shift the states of the original logic. New test bench data is serially input during serial outputting of the captured data. In addition, no feedback path is provided to restore the captured states to the original logic during serial outputting of the captured data.

Thus, various conventional systems may require an extra hardware flip-flop to measure an existing flip-flop, cannot monitor in realtime, have no feedback loop, and/or are only suited for testing rather than for emulation. The present disclosure addresses these and other issues.

SUMMARY OF THE INVENTION

These and other drawbacks and disadvantages of the prior art are addressed by systems and methods for digital circuit emulation system with state extraction.

An exemplary system for digital circuit emulation system with state extraction includes at least one trace chain and a trace memory in signal communication with the at least one trace chain for sequentially receiving values and feeding them back through the chain to their original storage unit positions.

An exemplary method for digital circuit emulation system with state extraction includes modeling the circuit, providing at least one storage unit in the model, emulating the circuit with the model, extracting a state of the at least one storage unit during emulation, storing the extracted state, and restoring the stored state through a feedback loop.

The present disclosure will be understood from the following description of exemplary embodiments, which is to be read in connection with the accompanying drawings.

BRIEF DESCRIPTION OF THE DRAWINGS

The present disclosure presents methods and apparatus for digital circuit testing and emulation systems in accordance with the following exemplary figures, wherein like elements may be indicated by like reference characters, and in which:

FIG. 12 shows a schematic data diagram for digital circuit emulation state data compression in accordance with an exemplary embodiment of the present disclosure.

DETAILED DESCRIPTION OF PREFERRED EMBODIMENTS

Figure 1:
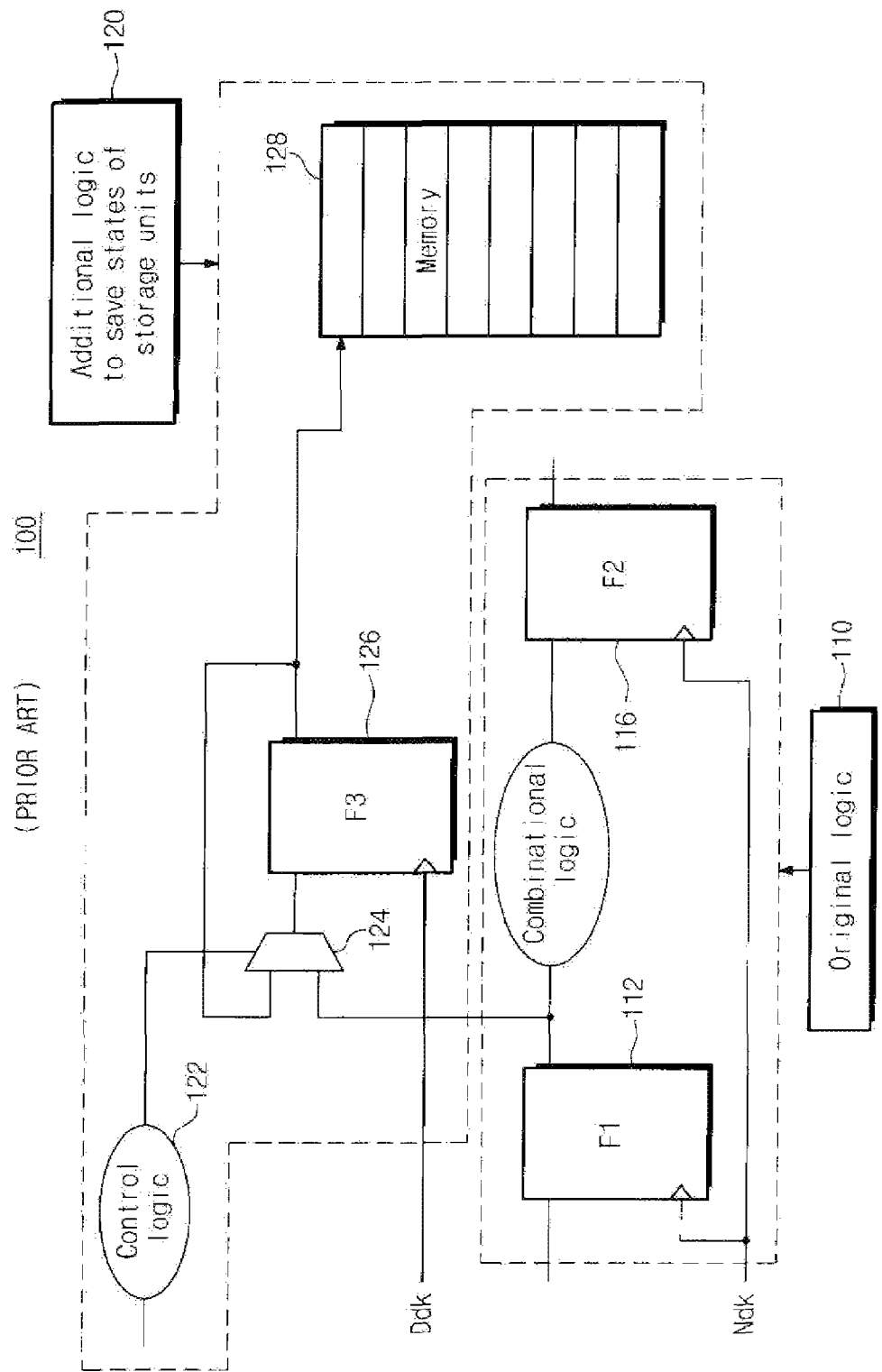
FIG. 1 shows a schematic circuit diagram for a conventional digital circuit testing system.
Figure 2:
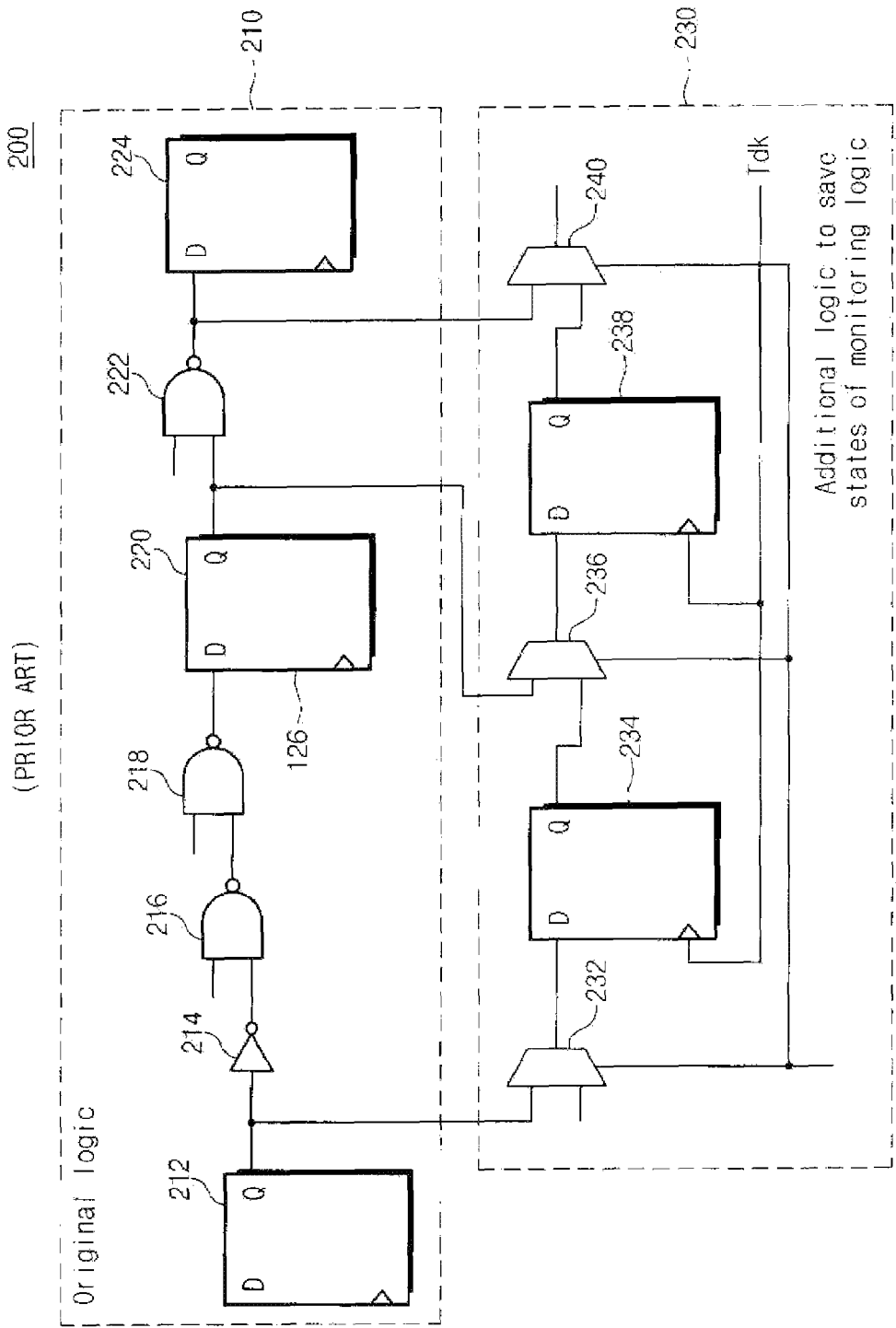
FIG. 2 shows a schematic circuit diagram for another conventional digital circuit testing system.
Figure 3:
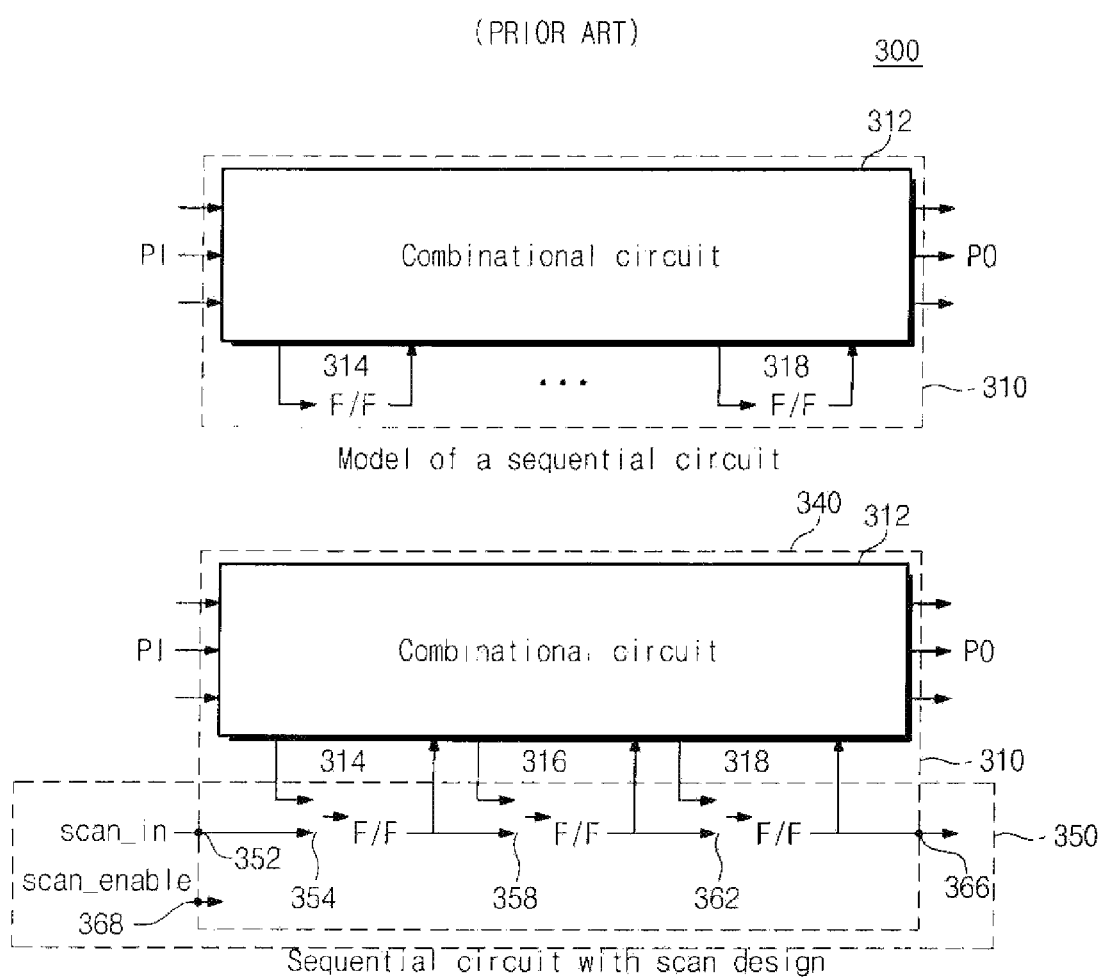
FIG. 3 shows a schematic circuit diagram for yet another conventional digital circuit testing system.

The present disclosure sets forth exemplary hardware emulation systems, including debugging and processing system to save, restore and change states of storage units in a target digital circuit for any particular simulation cycle. A preferred embodiment provides a fast debugging system using trace chains to save, restore and change the states for all of the storage units in a target digital circuit.

If all of the storage states are saved at every clock cycle, the data can be quickly reused for tasks such as monitoring, simulation, and/or analysis. Feedback paths are provided to restore the captured states to the original logic during serial outputting of the captured data to an external interface.

An environment for Distributed Simultaneous-Cycle Based Simulation (DS-CBS) is created by saving and restoring states of storage units in the original logic. A digital circuit may be divided into independent segments closed by storage units. Here, the independent segments can be simulated simultaneously such that many independent circuits are simultaneously processed. The independent segments closed by storage units are said to have "spatial independence". In addition, a simulation may be started from any particular time based on the data stored from the digital circuit during a previous simulation. This property is called "time-wise independence".

The storage states may be saved every clock cycle during pre-layout, such as RTL or gate layout or during post-layout simulation. Similarly the storage states may be used every clock cycle during pre-layout and/or post-layout simulation to save simulation time. An aspect of the present disclosure provides a basic logic model for a DS-CBS system.

As used herein, "pre-layout simulation" is a zero delay simulation before a delay annotation is applied to the circuit elements (e.g., flip-fops, gates, transistors) and nets. Pre-layout simulation includes RTL and gate simulation without a delay annotation. Post-layout simulations is a delay simulation after delays are annotated into the circuit elements (e.g., flip-flops, gates, transistors) and nets. "Clock domain" means a group of clock nets that are connected to the same clock. "Storage tracer" uses a real storage element such as a flip-flop or latch. "Net tracer" uses a pseudo storage element, and is closed by inserting storage elements into inputs and outputs of an addressable memory and clock control nets, which makes an effective clock state at every clock cycle. "Clock tracer" uses a pseudo storage element to store a state of a clock net at every clock cycle. A "storage unit" includes any real storage elements synchronous with a clock such as flip-flop or latch. A "memory cell" or "macro cell" may have a pseudo storage element such as a flip-fop in the input and/or output ports to store the input and/or output states at every clock cycle, respectively. A "net/clock tracer" includes pseudo storage elements such as a flip-flop to monitor or store any desired net and clock nodes at every clock cycle.

The concepts of equivalent circuit and storage unit are used in the present disclosure. Every digital circuit generally consists of a sequential circuit and a combinational circuit. Every digital circuit generally has an equivalent circuit, which models the original circuit with storage units and combinational units between the storage units.

Embodiments of the present disclosure may save all of the states of the target digital circuit at every clock cycle by invoking the concept of "storage unit". These and other embodiments of the present disclosure, which may be applicable to various kinds of digital circuits, save all of the states at every clock cycle, and restore all of the states at a particular simulation time by reusing the stored data of the storage units. In the target digital circuit. Thus, exemplary embodiments can quickly generate the states of the storage units for either zero delay simulation and/or hardware emulation with a hardware emulator or a Field Programmable Gate-Array (FPGA).

If all of the states of storage units in the target digital circuit are available, the state of the digital circuit can be restored at any predetermined cycle without an additional simulation from the beginning. The stored states of storage units in the target digital circuit can be applied to the equivalent net lists synthesized in different environments or design libraries, as well as to the original digital circuit because the storage units between the two different net lists are maintained to be mapped equally even if the combinational logic may be different after synthesis.

In addition to the fast simulation, a functional verification can be made according the expected states of storage units and the calculated states of storage units between two equivalent net lists during the digital circuit design.

Figure 4:
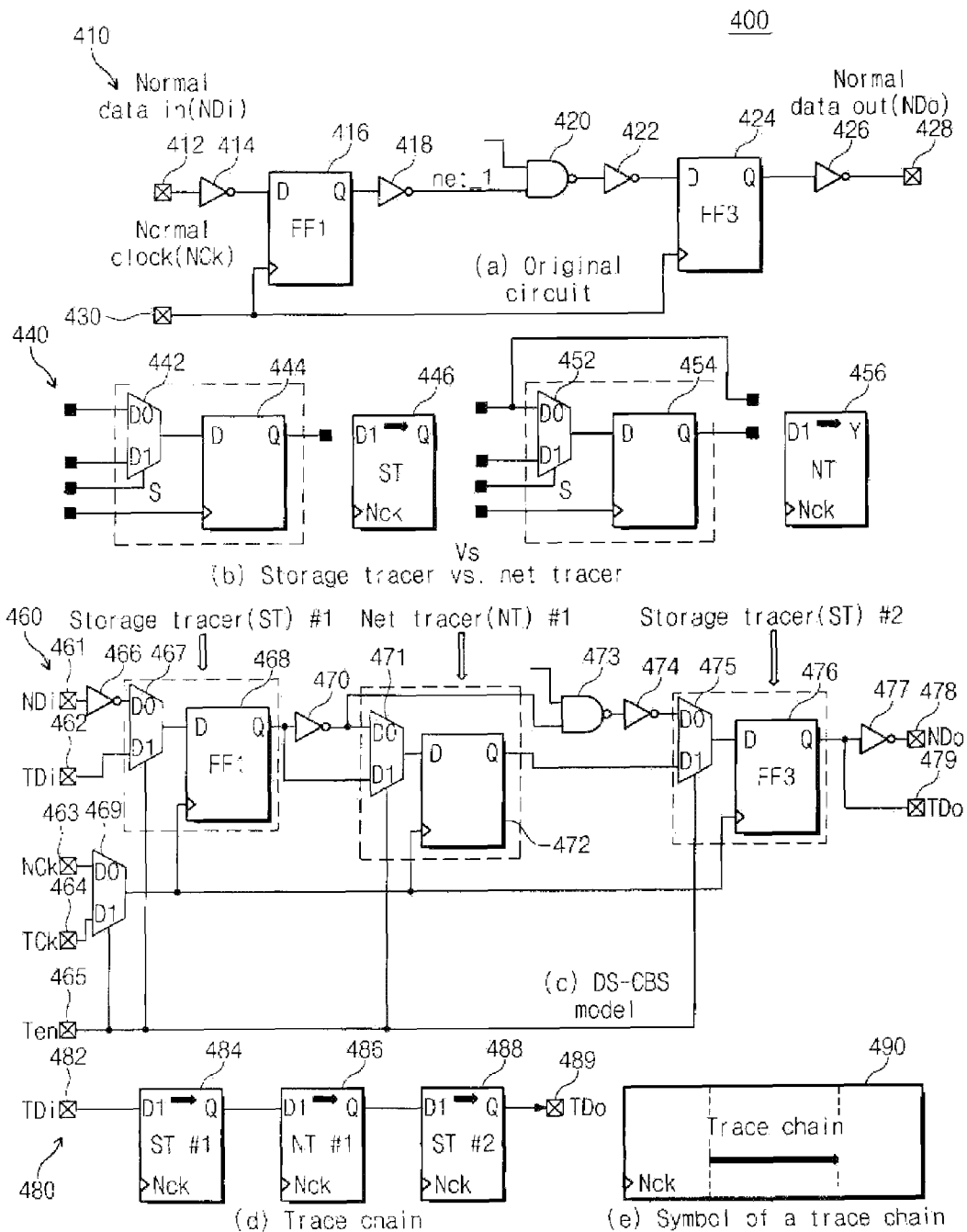
FIG. 4 shows a schematic circuit diagram for a digital circuit emulation system with state extraction in accordance with an exemplary embodiment of the present disclosure.

As shown in FIG. 4, a digital circuit emulation system with state extraction in accordance with an exemplary embodiment of the present disclosure is indicated generally by the reference numeral 400. An original circuit 410 includes a normal data in (NDi) terminal 412. An inverter 414 is in signal communication with the terminal 412. A first flip-flop 416 is in signal communication with the inverter 414, and with a normal clock input (NCk) terminal 430. An inverter 418 is in signal communication with the flip-flop 416, and a NAND gate 420 is in signal communication with the inverter 418. An inverter 422 is in signal communication with the NAND gate 420. A second flip-flop 424 is in signal communication with the inverter 422, and is in signal communication with the NCk terminal 430. An inverter 426 is in signal communication with the second flip-flop 424, and a normal data out (NDo) terminal is in signal communication with the inverter 426.

A Storage Tracer (ST) circuit 440 includes a multiplexer 442, and a flip-flop 444 having an input in signal communication with the output of the multiplexer 442. The Storage Tracer circuit 440 has four signal inputs and one signal output. A Storage Tracer schematic 446 is defined as equivalent to the Storage Tracer circuit 440.

A Net Tracer (NT) circuit 450 includes a multiplexer 452, and a flip-flop 454 having an input in signal communication with the output of the multiplexer 452. In addition, a first input of the Net Tracer is bridged as an output. This, the Net Tracer circuit 450 has four signal inputs and two signal outputs. A Net Tracer schematic 456 is defined as equivalent to the Net Tracer circuit 450.

A DS-CBS model 460 includes a normal data in (NDi) terminal 461, a test data in (TDi) terminal 462, a normal clock (NCk) terminal 463, a test clock (TCk) terminal 464, and a test enable (TEn) terminal 465. An inverter 466 is in signal communication with the NDi terminal, a multiplexer 468 is in signal communication with the inverter 466, and a data input of a flip-flop 468 is in signal communication with the output of the multiplexer 467. A clock input of the multiplexer 468 is in signal communication with the test enable terminal. Another multiplexer 469 is in signal communication with the with the NCk and TCk terminals. A clock input of the flip-flop 468 is in signal communication with the output of the multiplexer 469. The output of the flip-flop 468 is in signal communication with an inverter 470. A first input of a multiplexer 471 is in signal communication with the inverter 470, and a second input is in signal communication with the output of the flip-flop 468. The multiplexer 471 has a clock input in signal communication with the test enable terminal. A flip-flop 472 is in signal communication with the multiplexer 471, and has a clock input in signal communication with the output of the multiplexer 469. A NAND gate 473 is in signal communication with the output of the inverter 470. An inverter 474 is in signal communication with the NAND gate 473, and a first input of a multiplexer 475 is in signal communication with the output of the inverter 474. A second input of the multiplexer 475 is in signal communication with the output of the flip-flop 472. The multiplexer 475 has a clock input in signal communication with the test enable terminal. A flip-flop 476 is in signal communication with the multiplexer 475, and has a clock input in signal communication with the output of the multiplexer 469. An inverter 477 is in signal communication with the output of the flip-flop 476. A normal data out (NDo) terminal 478 is in signal communication with the output of the inverter 477, and a test data out (TDo) terminal 479 is in signal communication with the output of the flip-flop 476. The circuit between the inputs to the multiplexer 467 and the output of the flip-flop 468 comprises a first Storage Tracer. The circuit between the output of the inverter 470 and the input of the NAND gate 473 comprises a Net Tracer. The circuit between the inputs to the multiplexer 475 and the output of the flip-flop 476 comprises a second Storage Tracer.

A trace chain circuit 480 represents the trace chain of the DS-CBS model 460, and includes a test data in (TDi) terminal 482, a first Storage Tracer (ST) 484 in signal communication with the TDi terminal, a Net Tracer (NT) 486 in signal communication with the first ST 484, a second ST 488 in signal communication with the NT 486 and a test data out (TDo) terminal 489 in signal communication with the second ST 488. A trace chain (TC) schematic 490 is defined as equivalent to the trace chain circuit 480.

Thus, to extract the states of the storage units, a net tracer is inserted into the original net list to monitor and store the state of the node (e.g. net_1 is the node between the output of the inverter 470 and the input of the NAND gate 473) or boundary of a macro cell at every clock cycle for a DS-CBS simulation. As described, the presently disclosed Net Tracer elements may be applied to a configuration of logic combined with a scan test or Storage Tracer configuration.

Figure 5:
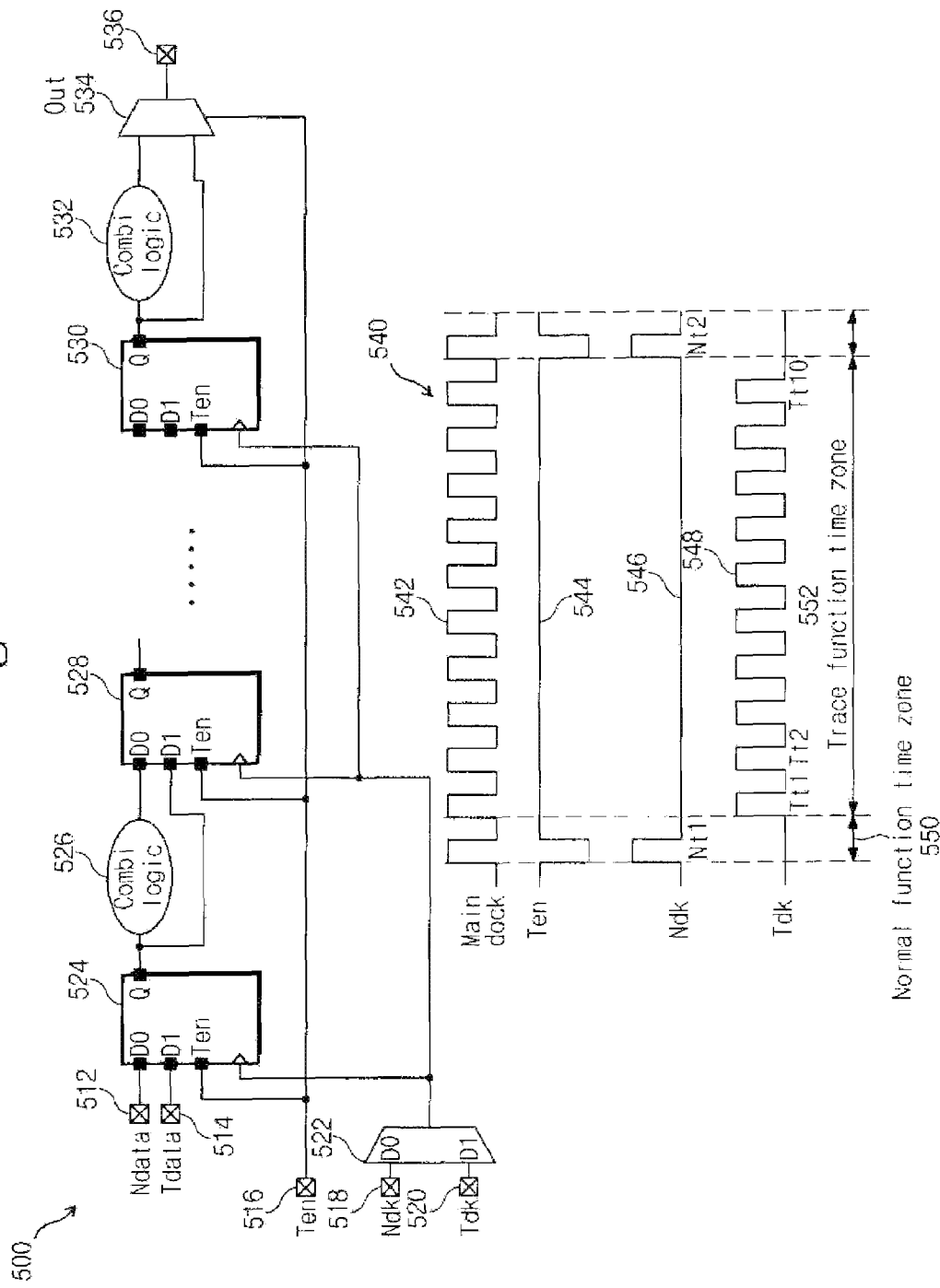
FIG. 5 shows a schematic timing diagram for a digital circuit emulation system with clock toggling in accordance with an exemplary embodiment of the present disclosure.

Turning to FIG. 5, a trace chain and corresponding timing diagram are indicated generally by the reference numeral 500. A trace chain 510 includes input terminals for normal data (NData) 512, test data (TData) 514, test enable (TEn) 516, normal clock (NClk) 518, and test clock (TClk) 520. A multiplexer 522 is in signal communication with the NClk and TClk terminals. A first tracer element 524 is in signal communication with the NData and TData terminals, the TEn terminal, and the output of the multiplexer 522. A combinational logic circuit 526 is in signal communication with the output of the first tracer element 524. A second tracer element 528 is in signal communication with the output of the circuit 526, the output of the first tracer element 524, the TEn terminal, and the output of the multiplexer 522. Intermediate tracer elements are omitted for brevity. A final tracer element 530 is in signal communication with a previous tracer element as for the element 528. A final combinational logic circuit 532 is in signal communication with the output of the final tracer element 530. A final multiplexer 534 is in signal communication with the final combinational logic circuit 532 and the final tracer element 530, and has a clock input in signal communication with the TEn terminal. An output terminal 536 is in signal communication with the final multiplexer 534. Thus, the multiplexer 522 toggles between two clock signals, the test clock (TClk) and the normal clock (NClk), to monitor and store the states of the storage units of the target logic in real time.

Figure 6:
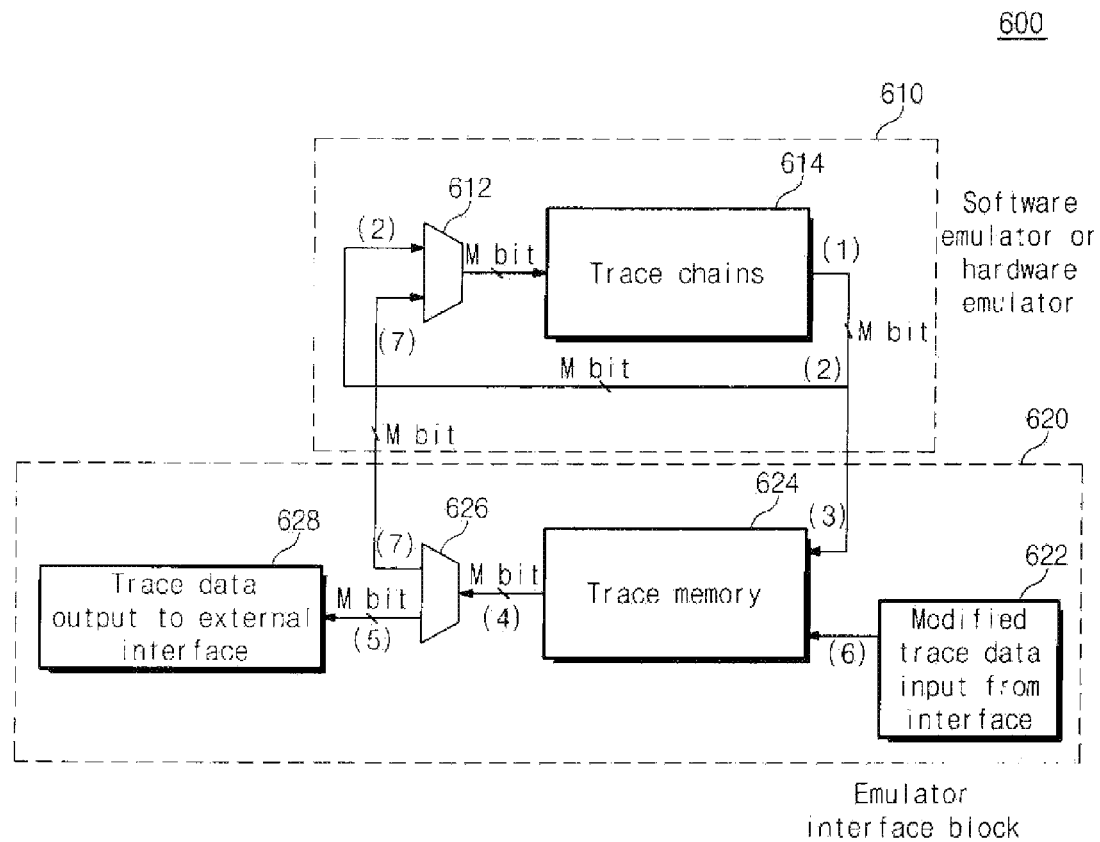
FIG. 6 shows a schematic block diagram for a digital circuit emulation system with state restoration in accordance with an exemplary embodiment of the present disclosure.

Turning now to FIG. 6, a digital circuit emulation system with state restoration is indicated generally by the reference numeral 600. The system 600 includes a software or hardware emulator 610 and an emulator interface block 620. The emulator 610 includes a M-bit multiplexers 612, and M-bit trace chains in signal communication with the M-bit multiplexers. Outputs of the trace chains are provided as feedback to first inputs of the multiplexers. The emulator interface block 620 includes a block 622 for receiving modified trace data input from an external source, a trace memory in signal communication with the block 622 and the output of the trace chains 614, M-bit de-multiplexers 626 in signal communication with the trace memory 624, with first outputs of the de-multiplexers in signal communication with seconds inputs of the multiplexers 612, and second outputs of the de-multiplexers 626 in signal communication with a block 628 for providing trace data output to an external interface.

Thus, the system 600 saves and restores the states of storage units by (a) extracting M-bit states of the storage units comprising the M trace chains at every trace cycle from the M trace chains through path 1; (b) providing the output M-bit data from the M-bit output of the trace chains as feedback to the M-bit input of the trace chains synchronous with the same trace clock during the extraction of M trace chains (N cycles) through path 2; (c) storing the M-bit output data from the M-bit output of the trace chains to an M×N trace memory (synchronous with the same trace clock) during the extraction of M trace chains through path 3; (d) providing the M-bit output data from path 4 to an external interface through 5 or restoring it to the target logic through 7; (e) optionally modifying the stored data in the trace memory to change the states of storage units in the target logic through 6; and (f) at the end of the trace cycles executing the successive normal operation at the next normal clock cycle.

Figure 7:
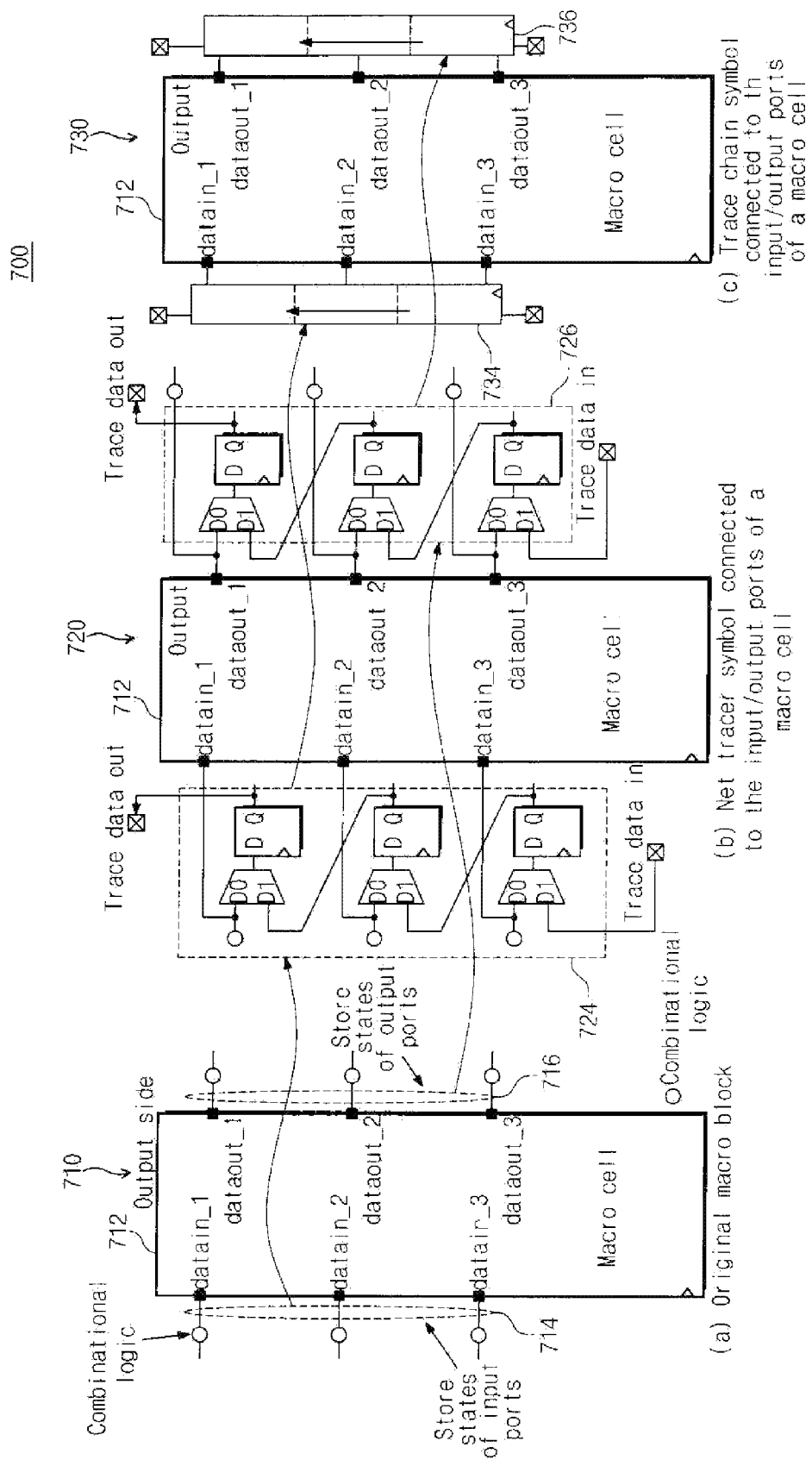
FIG. 7 shows a schematic circuit diagram for a digital circuit emulation system with trace chain in accordance with an exemplary embodiment of the present disclosure.

As shown in FIG. 7, a trace chain for a macro cell is indicated generally by the reference numeral 700. An original macro block 710 includes an original macro cell 712 having input ports data_in_1, data_in_2 and data_in_3 with unknown input states 714 and output ports data_out_1, data_out_2 and data_out_3 with unknown output states 716. A macro block 720 includes the macro cell 712, with Net Tracer elements 724 connected to the input ports to measure the input states 714 and Net Tracer elements 726 connected to the output ports to measure the output states 716. A macro block 730 includes the macro cell 712, with a Trace Chain element 734 connected to the input ports to measure the input states 714 and a Trace Chain element 736 connected to the output ports to measure the output states 716.

Thus, there is no need to save all of the states of the memory cells or elements inside of the macro cell. Sampling the inputs or the outputs is all that is needed to save all of the pertinent states of the macro cell. This is accomplished by making trace chains for input ports and for the output ports with Net Tracers. Each trace chain may be serially connected to another trace chain in the same clock domain. A control signal Sel_1 is provided to a Net Tracer element to select a multiplexer's first input D0 path during normal operation and to select the multiplexer's second input D1 path during shifting mode.

Figure 8A:
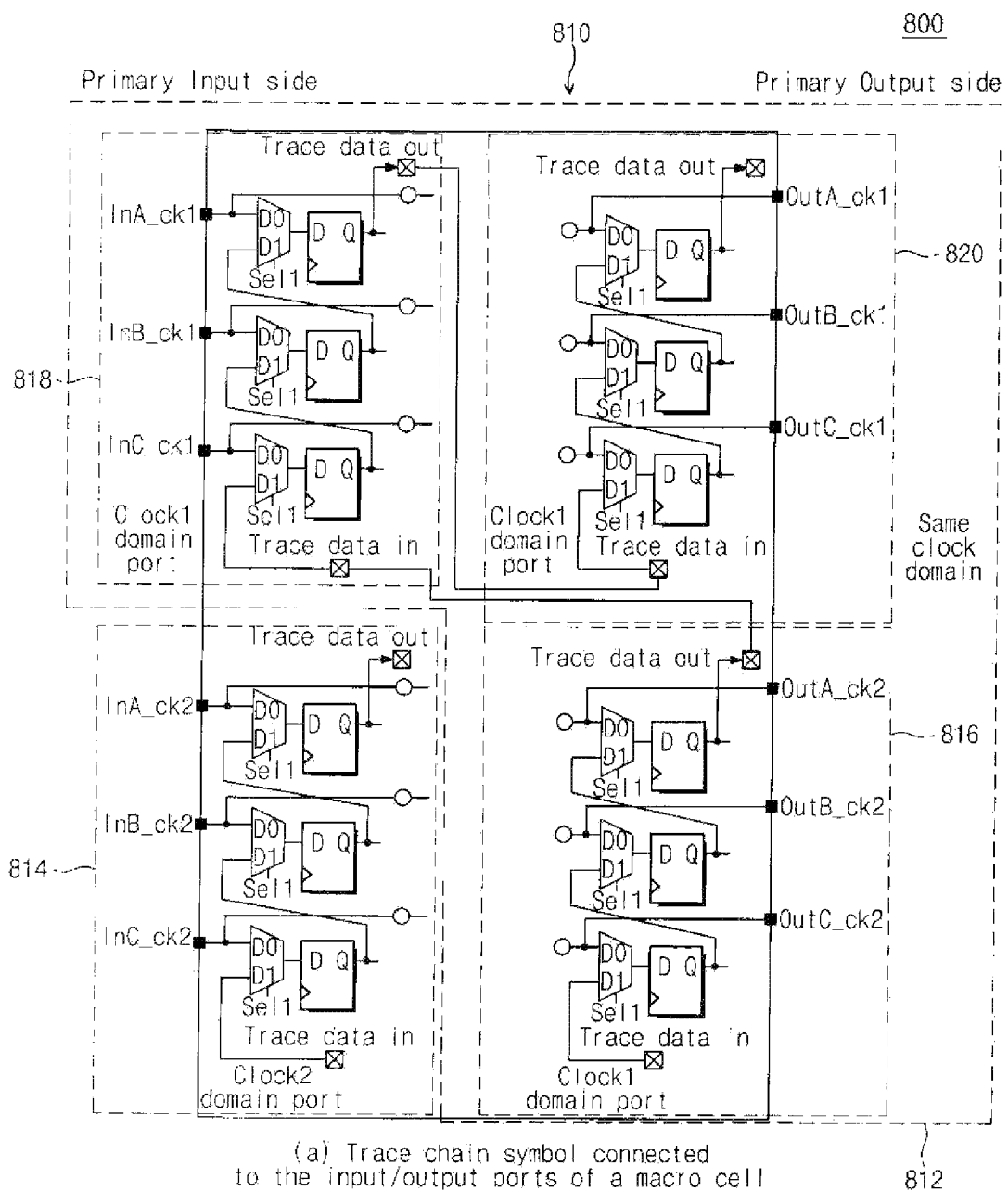
FIG. 8 shows a schematic circuit diagram for a digital circuit emulation system with different clock domains in accordance with an exemplary embodiment of the present disclosure.
Figure 8B:
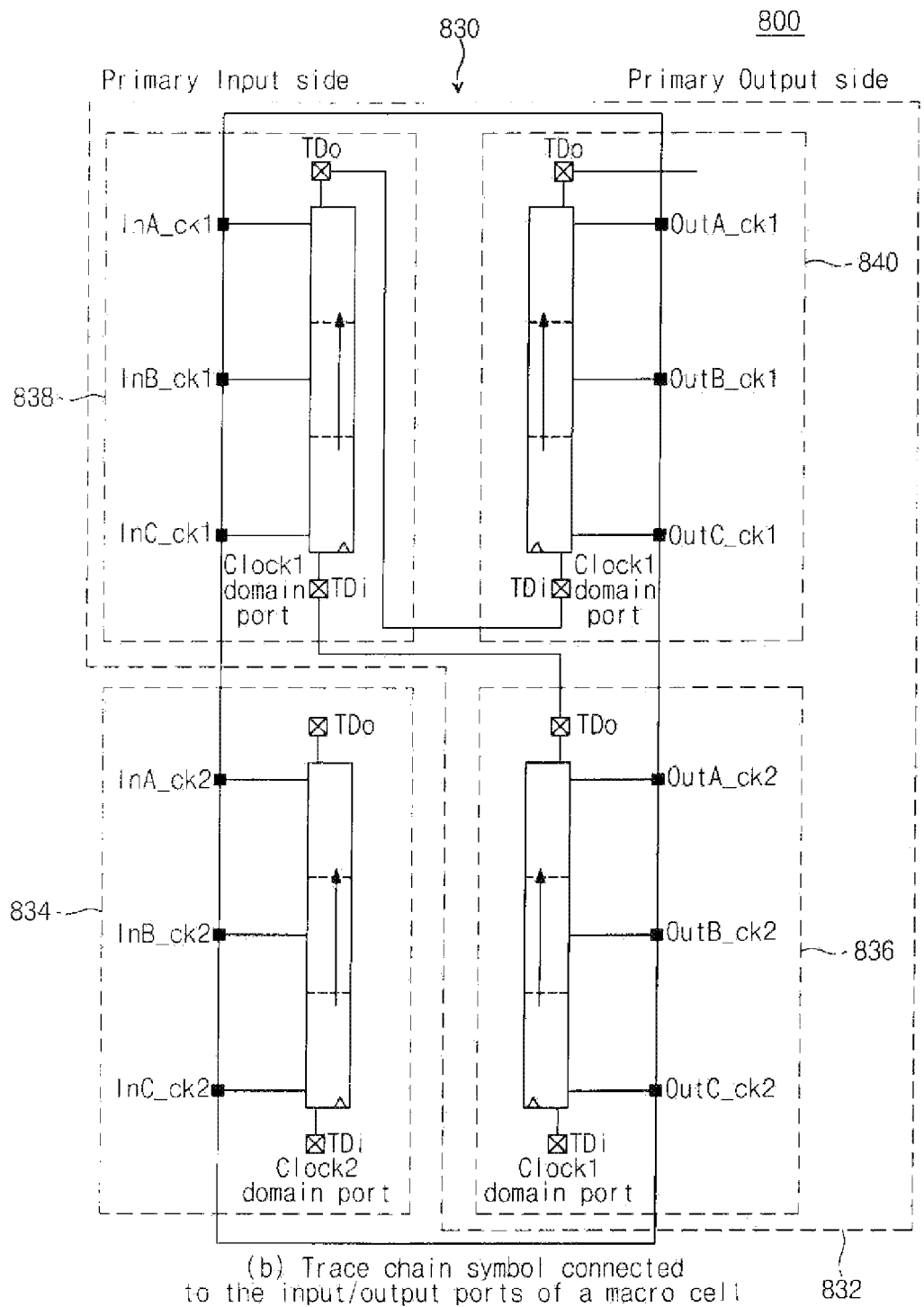

Turning to FIG. 8, a digital circuit emulation system with different clock domains in a hierarchical level are indicated generally by the reference numeral 800. A system schematic using tracer elements is indicated by the numeral 810, and includes a first clock domain 812, and a second clock domain 814. The first clock domain 812 includes a first sub-chain 816, which traces the outputs of one macro block, a second sub-chain 818, which traces the inputs of a second macro block, and a third sub-chain 820, which traces the outputs of the second macro block. The first through third sub-chains are connected together as a single trace chain by connecting the trace data output from one sub-chain to the trace data input of the next sub-chain. This is possible because the first through third sub-chains are all in the same clock domain using Clock 1.

A system schematic using trace chain elements is indicated by the numeral 830, and includes a first clock domain 832, and a second clock domain 834. The first clock domain 832 includes a first trace chain element 836, which traces the outputs of one macro block, a second trace chain element 838, which traces the inputs of a second macro block, and a third trace chain element 840, which traces the outputs of the second macro block. The first through third trace chain elements are connected together as a single or combined trace chain by connecting the trace data output from one trace chain element to the trace data input of the next trace chain element. As above, this is possible because the first through third trace chain elements are all in the same clock domain using Clock 1. Thus, each trace chain may be serially connected to another trace chain as tong as the trace chains to be connected are in the same clock domain.

Figure 9:
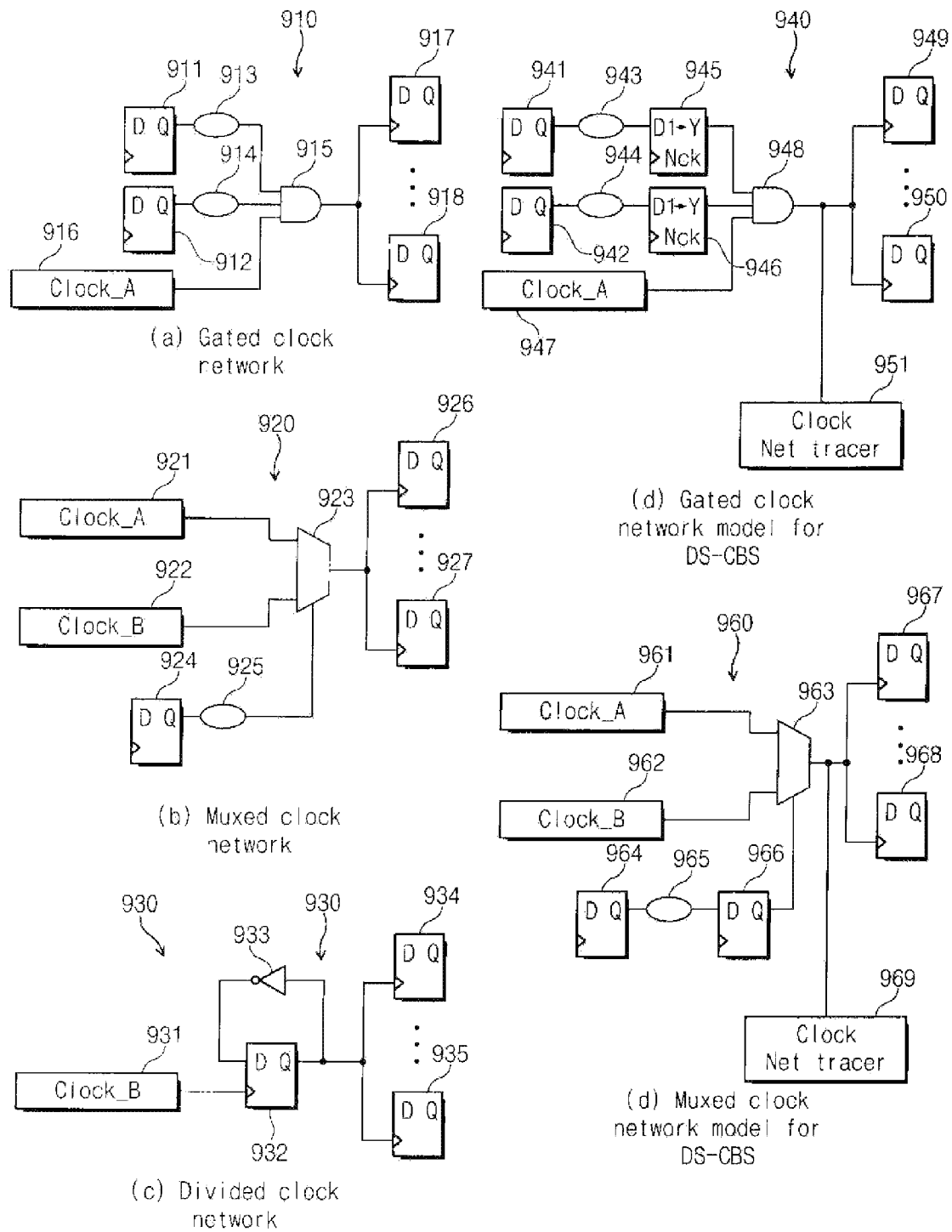
FIG. 9 shows a schematic circuit diagram for digital circuit emulation clock networks in accordance with an exemplary embodiment of the present disclosure.

Turning now to FIG. 9, clock networks for use in DS-CBS are indicated generally by the reference numeral 900. A gated clock network 910 includes a plurality of storage elements, such as flip-flops 911 and 912, each optionally in series with combinational logic such as 913 and 914, respectively, where their outputs are ANDed together with a clock input, such as Clock_A terminal 916, and the output of the AND gate 915 is used as a gated clock signal for other storage elements, such as 917 and 918. A gated clock network model 940 for DS-CBS includes a first flip-flop 941 and a second flip-flop 942, first combinational logic 943 in signal communication with the first flip-flop 941 second combinational logic 944 in signal communication with the second flip-flop 942, a first Net Tracer (NT) 945 in signal communication with the first combinational logic 943, a second Net Tracer (NT) 946 in signal communication with the second combinational logic 944, a clock input terminal 947, and an AND gate 948 having inputs in signal communication with the outputs of the NT 945, the NT 946, and the clock terminal 947. The output of the AND gate 948 is used as a gated clock signal for other flip-flops or storage elements, such as 949 and 950, and as input to a clock net tracer 951. Here, a clock control point (CCP) is defined at each of the NT outputs to the AND gate.

A clock domain is a region having storage units connected to the same clock. A clock node is defined in order to detect states of the clock node in advance with Net Tracers inserted into a clock control point (CCP). The CCP is a node used to control a final clock state, to pre-determine the state of the clock source with the stored states of storage units inside a region connected to the clock node, and then to make a DS-CBS simulation.

A multiplexed clock network 920 includes a plurality of clock input terminals, such as Clock_A terminal 921 and Clock_B terminal 922: a multiplexer 923 having data inputs in signal communication with the terminals 921 and 922: a storage unit 924 in signal communication with combinational logic 925, the output of which is used as an enabling input to the multiplexer 923. The output of the multiplexer 923 is used as a multiplexed clock signal for other storage elements, such as 926 and 927. A multiplexed clock network model 960 for DS-CBS includes a plurality of cock input terminals, such as Clock_A terminal 961 and Clock_B terminal 962, a multiplexer 963 having data inputs in signal communication with the terminals 961 and 962, a storage unit 964 in signal communication with combinational logic 965, and an inserted Net Tracer (NT) 966 in signal communication with the combinational logic 965, the output of which is used as an enabling input to the multiplexer 963. The output of the multiplexer 963 is used as a multiplexed clock signal for other storage elements, such as 967 and 968, and as input to a clock net tracer 969. Here, a clock control point (CCP) is defined at the NT output to the multiplexer.

A divided clock network 930 includes a clock input terminal 931 in signal communication with a clock input of a storage unit 932, an inverter in signal communication with the output of the storage unit, and a data input of the storage unit 932 in signal communication with the inverter 933. In additions the output of the storage unit is used as a divided clock signal for other storage elements, such as 934 and 935. There is no need to insert a Net Tracer into a divided clock network since the original clock source, such as Clock_1, in a divided clock network can become a reference clock for all of the storage units following the T flip-flop connected to Clock_1.

Figure 10:
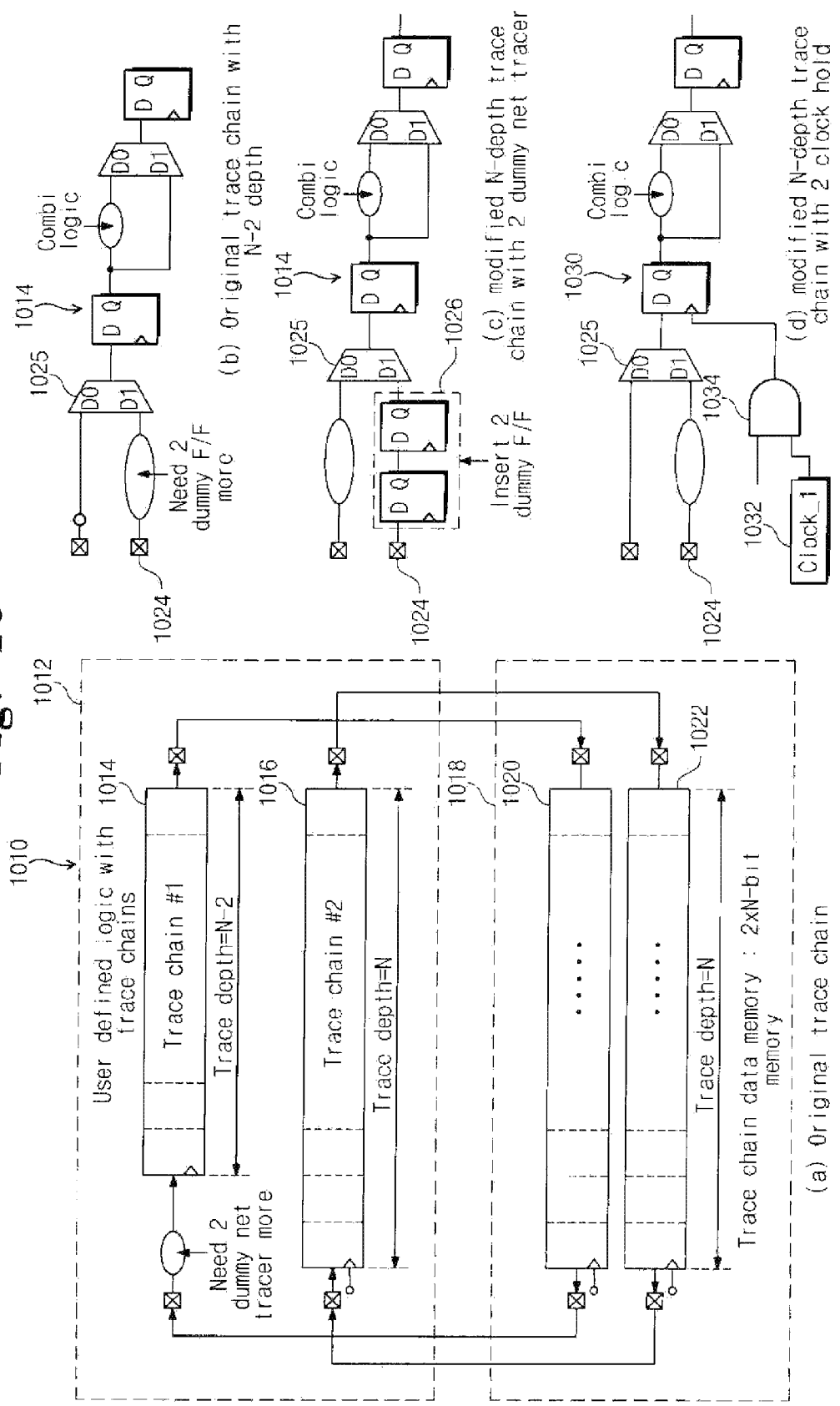
FIG. 10 shows a schematic circuit diagram for digital circuit emulation chain depths in accordance with an exemplary embodiment of the present disclosure.

As shown in FIG. 10, trace chains with different depths are indicated generally by the reference numeral 1000. Two original trace chains with mis-matched depths are indicated generally by 110. The user defined logic with trace chains 1012 includes a first trace chain 1014 with a depth of N-2, and a second trace chain 1016 with a depth of N. A trace chain data memory 1018 includes a 2xN bit memory, with a first portion or 1xN bit memory 1020 connected to the first trace chain 1014, and a second portion or 1xN bit memory 1022 connected to the second trace chain 1016. Thus, in order to match the trace chain depth of trace chain 1014, which is N-2, to the depth of its memory allotment, which is N, two dummy Net Tracers may be added to the trace chain 1014. The original trace chain 1014 includes a plurality of storage units preceded by a trace data input terminal 1024 and a multiplexer 1025. Two Net Tracers 1026 are inserted between the terminal 1024 and the multiplexer 1025. In an alternate solution using the circuit 1030, no Net Tracers need to be added, but appropriate delays are applied to the clock signal received on terminal 1032, such as with an AND gate 1034, to provide a modified N-depth trace chain with a two crock cycle hold time.

Thus, a trace chain is made to have substantially the same depth as a trace memory to store the states of the storage units. The depth of the trace memory may be selected as the maximum depth needed for any one of a plurality of trace chains to be processed simultaneously. If a trace chain depth is smaller than the depth of the trace memory, the trace chain may have dummy net tracers added to adjust the depth of the trace chain. Alternatively, if the trace chain depth is smaller than the depth of the trace memory, the trace clock input to the trace chain may be held to adjust the depth of the trace chain.

Figure 11:
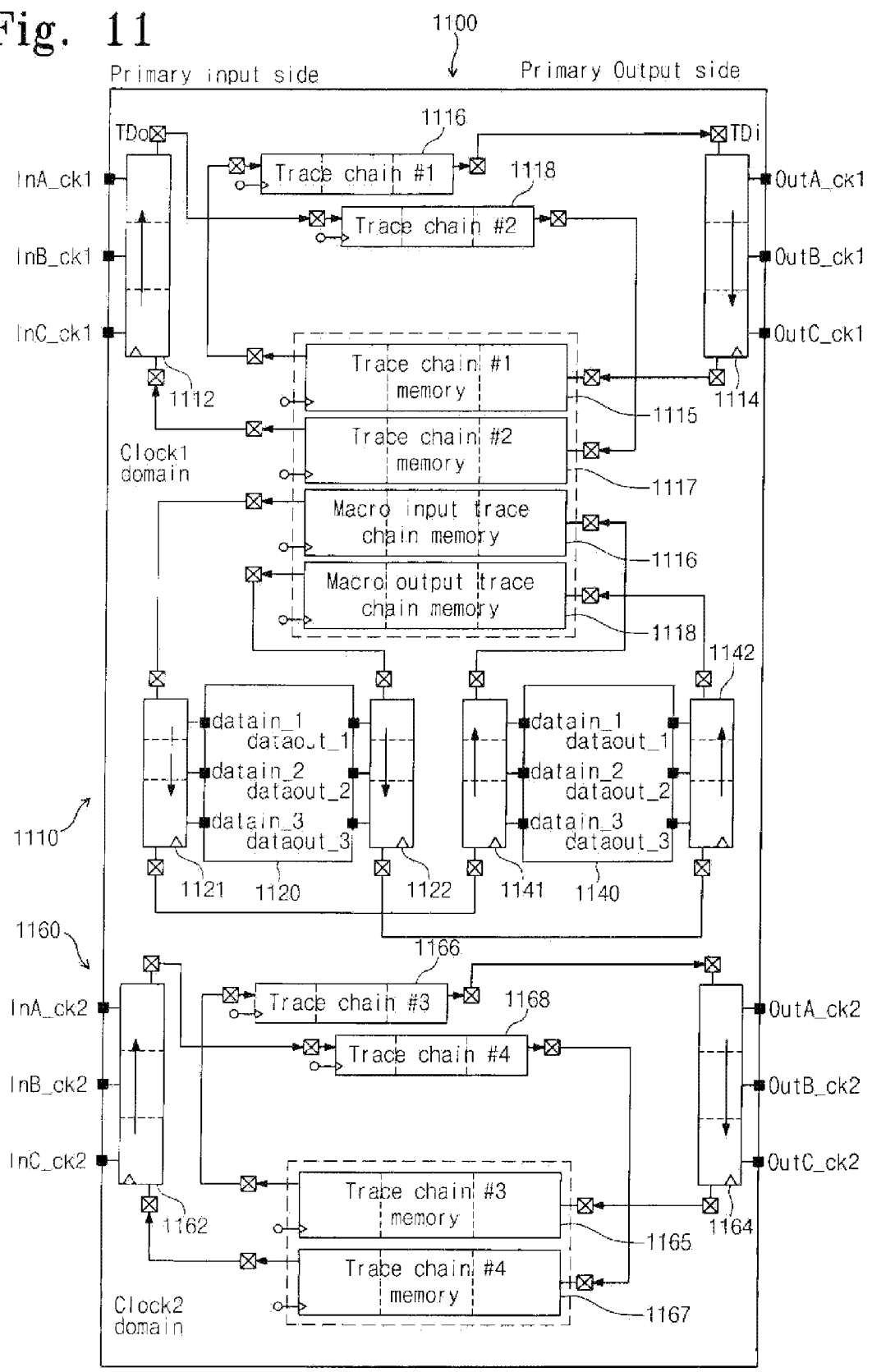
FIG. 11 shows a schematic circuit diagram for digital circuit emulation trace chains in accordance with an exemplary embodiment of the present disclosure.

Turning to FIG. 11, a digital emulation circuit with trace chains is indicated generally by the reference numeral 1100. The circuit 1100 includes a first clock domain 1110 and a second clock domain 1160. The first clock domain 1110 includes three inputs, InA_Ck1, InB_Ck1 and InC_Ck1, and three outputs, OutA_Ck1, OutB_Ck1 and OutC_Ck1. The inputs are connected to a Clock1 input trace chain 1112 and the outputs are connected to a Clock1 output trace chain 1114. A first trace chain memory 1115 is in signal communication with the output trace chain 1114 for receiving output test data (TDo) from the output chain 1114. A first internal trace chain 1116 is in signal communication with the first chain memory 1115, and provides input test data (TDi) to the output chain 1114. A second trace chain memory 1117 is in signal communication with the input trace chain 1112 for providing input test data (TDi) to the input chain 1112. A second internal trace chain 1118 is in signal communication with the input chain 1112 and receives output test data (TDo) from the input chain 1112. The second chain memory 1117 is in signal communication with the second trace chain 1118.

The circuit 1100 further includes a memory 1120 and a macro cell 1140. The memory 1120 is connected between an input trace chain 1121 and an output trace chain 1122. The macro cell 1140 is connected between an input trace chain 1141 and an output trace chain 1142. The output chain 1142 is connected to a macro output trace chain memory 1144, which is connected to the output chain 1122 of the memory 1120. The output chain 1122, in turn, is connected to the output chain 1142 of the macro cell 1140. The input chain 1141 of the macro cell 1140 is connected to a macro input trace chain memory 1146. The chain 1146 is connected to the input chain 1121 of the memory 1120. The input chain 1121, in turn, is connected to the input chain 1141 of the macro cell 1140.

The second clock domain 1160 includes three inputs, InA_Ck2, InB_Ck2 and InC_Ck2, and three outputs, OutA_Ck2, OutB_Ck2 and OutC_Ck2. The inputs are connected to a Clock2 input trace chain 1162, and the outputs are connected to a Clock2 output trace chain 1164. A third trace chain memory 1165 is in signal communication with the output trace chain 1164 for receiving output test data (TDo) from the output chain 1164. A third internal trace chain 1166 is in signal communication with the third chain memory 1165>and provides input test data (TDi) to the output chain 1164. A fourth trace chain memory 1167 is in signal communication with the input trace chain 1162 for providing input test data (TDi) to the input chain 1162. A fourth internal trace chain 1168 is in signal communication with the input chain 1162 and receives output test data (TDo) from the input chain 1162. The fourth chain memory 1167 is in signal communication with the fourth trace chain 1168.

Here, the trace chains may be divided according to the clock domains that are connected to the trace chains. In addition, the trace chains may be divided according to the port direction of the trace chains, such as all input chains or all output chains. A trace chain may be divided into several pieces of chains, which each have a suitable depth of chain. If a trace chain does not fit into the depth of the trace memory, the trace chain may be modified to have the same depth of the chain memory by means of a dummy Net Tracer or by means of a clock hold.

Turning now to FIG. 12, equivalent trace chains are indicated generally by the reference numeral 1200. A serial trace chain 1210 includes data bits a[3:0], b[3:0] and s[4:0] arranged in a serial format for storage in a trace memory. Parallel trace chains 1220, including chains 1230, 1240, 1250, 1260 and 1270: include the same data arranged in a parallel format. Here, each of the zeroth data bits are stored in the chain 1270, each of the first data bits are stored in the chain 1260, each of the second data bits are stored in the chain 1250, each of the third data bits are stored in the chain 1240, and each of the fourth data bits are stored in the chain 1230. Since there are fewer fourth data bits than zeroth through third data bits, The chain 1230 may be padded with dummy data bits.

The state data of the storage units may be compressed. That is, the changes in the states of the storage units in a target logic circuit for successive clock cycles provides a chance to compress the state data into a small sized memory. A portion of the trace memory such as a[3:0], b[3:0], and s[4:0] may have a relation to the next portion to store the states of the same storage units in next clock cycle. The trace data may be compressed according to a relation between the successive portions in order to store states of the same storage units. The trace data may also be compressed according to bit sequences in the trace memory. The compression algorithm may include any kind of compression algorithms such as Huffman, arithmetic compression algorithms, and the like.

Figure 13:
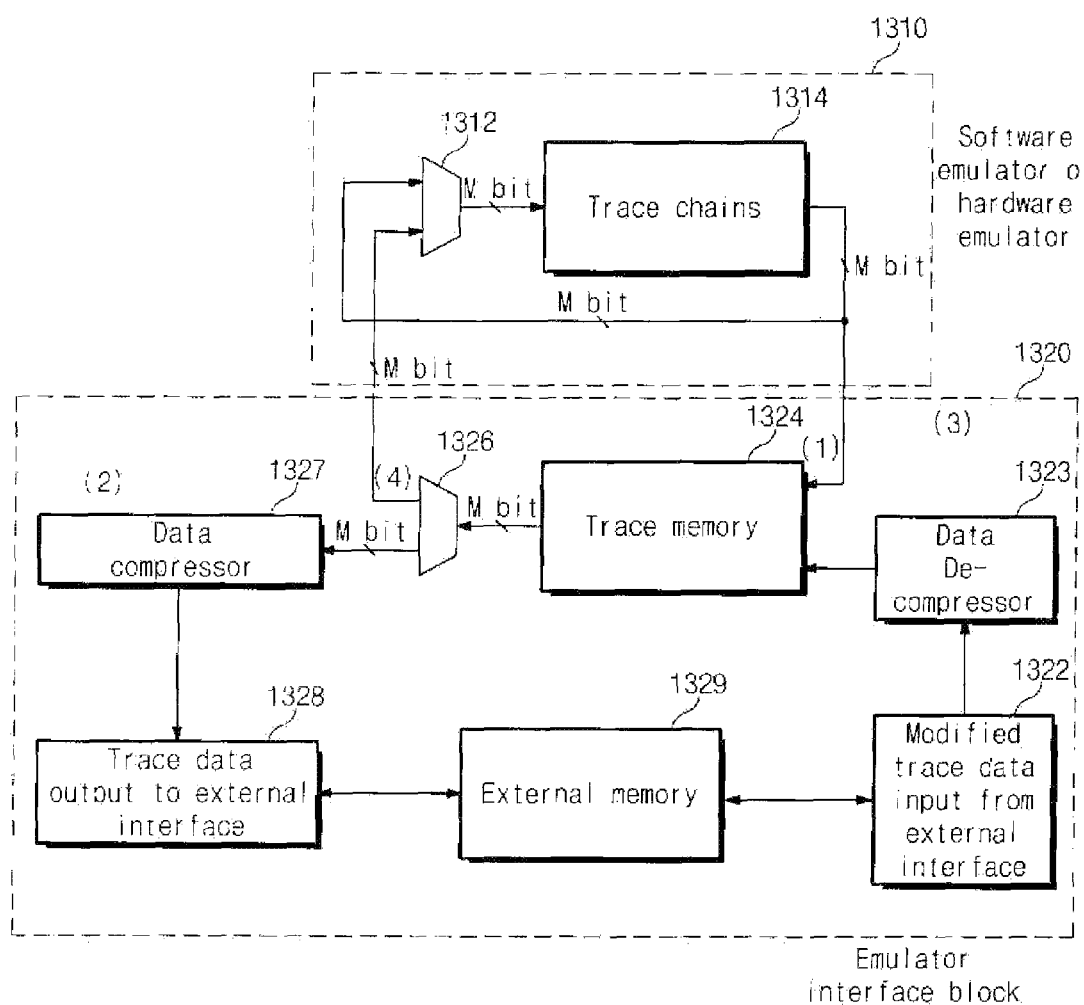
FIG. 13 shows a schematic block diagram for a digital circuit emulation system with state data compression in accordance with an exemplary embodiment of the present disclosure.

As shown in FIG. 13, digital circuit emulation system with state data compression is indicated generally by the reference numeral 1300. The system 1300 includes a software or hardware emulator 1310 and an emulator interface block 1320. The emulator 1310 includes a M-bit multiplexers 1312, and M-bit trace chains in signal communication with the M-bit multiplexers. Outputs of the trace chains are provided as feedback to first inputs of the multiplexers. The emulator interface block 1320 includes a block 1322 for receiving modified trace data input from a compressed external memory 1329, a data de-compressor 1323 in signal communication with the block 1322 a trace memory 1324 in signal communication with the de-compressor 1323 and the output of the trace chains 1314, M-bit de-multiplexers 1326 in signal communication with the trace memory 1324, with first outputs of the de-multiplexers in signal communication with seconds inputs of the multiplexers 1312, and second outputs of the de-multiplexers 1326 in signal communication with a data compressor 1327, and a block 1328 in signal communication with the compressor 1327 for providing trace data output to the compressed external memory 1329.

In operation, the extracted states of the storage units in the target logic circuit may be compressed and stored into a trace memory or an external memory. The data compressor and de-compressor may be located at both ends of the trace memory.

An exemplary application includes rollback emulation. If it is desired to stop a simulation/emulation and rollback the current states of simulation to the past states of a particular past times the emulator must store some primarily necessary states of the target logic circuit. If all of the states of all input ports of top level and all output ports of memory or macro modules are stored at every clock cycle, the system can restore the states of the target logic at any particular past cycle.

For example, if all of the states of all storage units have been saved at every clock cycle, the system may restore the states of the target logic at a particular clock cycle from the trace memory, which has the past states of the storage units. If, on the other hand, all the states of all storage units are not saved at every clock cycles but at a fixed time interval, the system must save all of the states of all input ports of top level and all of the output ports of the memory or macro modules at the time of the state changes to rollback the past input stimulus to the top level input port for a test bench reenactment of a past clock cycle, and then the rollback can proceed to the nearest time preceding the desired return time. If it is desired to rollback the past input stimulus to the top level input port for a test bench reenactment of a past clock cycle, a trace chain may be assigned to the input port of the top level and this chain may be merged into the total chains of the target logic circuit.

The states of the storage units in the target logic circuit may include information regarding the operating clock. Further, the extracted states of the storage units from an emulator may be transferred to a computer via PCI bus or any kind of bus interface for simulation and/or analysis. In addition, the stored states of the storage units may be changed by a user, and then may be updated to test the target logic circuit with the changed states of storage units.

In an exemplary test procedure, the system performance for the extraction of storage unit states was analyzed. The test used a Pentimum4 2.6 GHz main CPU, 512 MB main memory, an interface to an emulator using a PCI Bus (Version2.0, 32 bit/33 MHz), an operating clock of the target logic in the Emulator (PCI transfer clock) of 33 MHz, a gate count of 2.5M (pure glue logic=1M), 32,000 flip-flops each, with a transfer rate of input data to the emulator comprising PCI bus burst mode and AXI Bus data transfer (real operating speed or the emulator) with no data compression, number of trace chains is 50, depth of a trace chain is 640 (32,000/50), data bus width of 32-bit (assuming that PCI bus can transfer data in 32-bit at every clock cycle in burst mode, total trace data of 32,000 bits, minimum number of necessary cycles is 1,000 cycles (32,000/32), bus utilization ratio of 66.7% number of real necessary cycles is 1,500 cycles (1,000×100/66.7), and soft emulation speed of 30 cps based on the Pentium 4 computer.

The performance for extracting states in a first test case included transferring all of the storage units from the emulator to a computer. No consideration of a rollback or a what if analysis was needed during the test time. No overlap between the state extract operation and state transfer operation was implemented. The total number of clock cycles to 1 step was 2140 cycles≈(1 normal clock(33 MHz)+640 shifting clocks (33 Mhz)+5 time index information header clocks+1,500 transfer clocks(33 Mhz)). If the PCI BUS is 32 bit at 33 Mhz, the resulting emulation speed is 15.2k cps (33M cycle/2140 cycle). If the PCI BUS is 64 bit at 33 Mhz, the resulting emulation speed is 30.4k cps (33M cycle/2140 cycle*2). If the PCI BUS is 64 bit at 66 Mhz, the resulting emulation speed is 60.8k cps (66M cycle/2140 cycle*2).

The performance for extracting states in a second test case included transferring a portion of the storage units (320 bits) from the emulator to a computer. No consideration of a rollback or a what if analysis was required during the test time. The total number of clock cycles to 1 step is 340 cycles≈(1 normal clock(33 MHz)+320 shifting clocks(33 MHz)+5 clock information header clocks+15 transfer clocks(33 Mhz)). If the PCI BUS is 32 bit at 33 Mhz, the resulting emulation speed is 97k cps (33M cycle/340 cycle). If the PCI BUS is 64 bit at 33 Mhz, the resulting emulation speed is 194k cps (33M cycle/340 cycle*2). If the PCI BUS is 64 bit at 66 Mhz, the resulting emulation speed is 388k cps (66M cycle/340 cycle*2).

Thus, digital circuit emulation systems in accordance with the present disclosure provide a remarkable increase in the emulation speed compared to software simulation speeds. The presently disclosed debugging architecture to quickly extract states of storage units, including memory cells or macro cells, is applicable to a reconfigurable hardware emulator. The changes to the target logic comprise adding additional Net Tracers to the original target logic. Exemplary system embodiments provide an expedient what if type of analysis without requiring an additional simulation from scratch, and provide an easy rollback method without need for a new simulation. Using embodiments of the present disclosure, debugging may now be accomplished in real time. In addition, saving, restoring, and modifying all of the states of the storage units of a target logic circuit is an available option at any time.

It is to be understood that the teachings of the present disclosure may be implemented in various forms of hardware, software, firmware, special purpose processors, or combinations thereof. Moreover, the software is preferably implemented as an application program tangibly embodied in a program storage device. The application program may be uploaded to, and executed by, a machine comprising any suitable architecture. Preferably, the machine is implemented on a computer platform having hardware such as one or more central processing units ("CPU"), a random access memory ("RAM") and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a display unit. The actual connections between the system components or the process function blocks may differ depending upon the manner in which the embodiment is programmed.

Although illustrative embodiments have been described herein with reference to the accompanying drawings, it is to be understood that the present disclosure is not limited to those precise embodiments, and that various other changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A method of emulating a circuit, the method comprising:
modeling the circuit;
providing at least one storage unit in the model;
emulating the circuit with the model;
extracting a state of the at least one storage unit during emulation;
storing the extracted state; and
simultaneously restoring the stored state to at least one storage unit through a feedback loop at substantially the same time as storing the extracted state.

2. A method as defined in claim 1, further comprising:
receiving external data; and
storing the received external data into the trace memory in place of an extracted state.

3. A method as defined in claim 1, further comprising:
providing a plurality of storage units in serial signal communication within the model;
sequentially extracting states of each of the plurality of storage units between emulation clock transitions;
storing the extracted states; and
sequentially restoring the stored states through a feedback loop.

4. A method as defined in claim 3, further comprising switching the plurality of storage units into serial signal communication using a plurality of multiplexers.

5. A method as defined in claim 3 wherein the plurality of storage units shares a common clock domain.

6. A method as defined in claim 3 wherein the plurality of storage units spans multiple clock domains.

7. A method as defined in claim 3, further comprising:
providing a second plurality of storage units in serial signal communication within the model;
sequentially extracting states of each of the second plurality of storage units in parallel with extracting states of each of the first plurality of storage units;
storing the extracted states of each of the second plurality of storage units; and
sequentially restoring the extracted states of each of the second plurality of storage units through the feedback loop in parallel with restoring states of each of the first plurality of storage units.

8. A method as defined in claim 7 wherein the number of the first plurality of storage units is the same as the number of the second plurality of storage units.

9. A method as defined in claim 7 wherein the number of the first plurality of storage units is less than the number of the second plurality of storage units, the method further comprising providing a number of trace-balancing storage units in serial signal communication with the first plurality of storage units to increase their number to that of the second plurality of storage units.

10. A method as defined in claim 7 wherein the number of the first plurality of storage units is less than the number of the second plurality of storage units, the method further comprising holding the clock to the first plurality of storage units for cycles equaling the difference in the numbers while extracting the second plurality of storage units.

11. A method as defined in claim 1, further comprising:
modeling storage units of the circuit;
extracting states of the storage units; and
emulating the circuit in accordance with the extracted states.

12. A method as defined in claim 1, further comprising:
providing a plurality of multiplexers, each connecting a storage unit in serial signal communication with another storage unit to form a trace chain;
sequentially extracting states of each of the plurality of storage units in the trace chain between emulation clock transitions;
storing the extracted states; and
restoring the extracted states to the trace chain through a feedback loop.

13. A method as defined in claim 12, further comprising:
providing a second plurality of multiplexers, each connecting a storage unit in serial signal communication with another storage unit to form a second trace chain;
sequentially extracting states of each of the plurality of storage units in the second trace chain between emulation clock transitions;
storing the extracted states; and
restoring the extracted states to the second trace chain through a feedback loop.

14. A method as defined in claim 1, further comprising providing a plurality of trace chains of different lengths.

15. A method as defined in claim 14 wherein the number of trace chains is equal to the number of parallel bit lines on an interface bus.

16. A method as defined in claim 14, further comprising storing and restoring all trace chains at each emulator clock transition.

17. A method as defined in claim 1 wherein at least one of the plurality of storage units is a cell comprising a pseudo storage unit in each of its output ports.

18. A method as defined in claim 1 wherein the step of emulating is cycle-based with zero delay.

19. A method as defined in claim 18, the plurality of storage units comprising real and pseudo storage units.

20. A method as defined in claim 1 wherein the step of emulating is event-driven with non-zero delay.

21. A method as defined in claim 20, the plurality of storage units comprising real storage units.

22. A method as defined in claim 1 wherein the circuit is digital.

23. A method of emulating a circuit, the method comprising:
modeling the circuit;
providing at least one storage unit in the model;
emulating the circuit with the model;
extracting a state of the at least one storage unit during emulation;
storing the extracted state;
restoring the stored state through a feedback loop;
providing a plurality of trace chains of different lengths; and
balancing the lengths of the trace chains by at least one of:
adding trace-balancing storage units to at least one trace chain to increase its length;
holding the clock of the at least one trace chain to read fewer states than for other trace chains;
combining two or more shorter trace chains to form a longer trace chain; or
disconnecting one or more longer trace chain to form two or more shorter trace chains.

* * * * *